United States Patent [19]
Hayashi

[11] Patent Number: 5,345,694
[45] Date of Patent: Sep. 13, 1994

[54] DRYING MACHINE
[75] Inventor: Kinya Hayashi, Tokyo, Japan
[73] Assignee: Kabushiki Kaisha Toshiba, Kanagawa, Japan
[21] Appl. No.: 87,406
[22] Filed: Jul. 8, 1993
[30] Foreign Application Priority Data
  Jul. 29, 1992 [JP] Japan .................. 4-202288
[51] Int. Cl.$^5$ .............................. F26B 19/00
[52] U.S. Cl. .......................... 34/550; 34/88; 34/562
[58] Field of Search .................. 34/48, 44, 89
[56] References Cited
  U.S. PATENT DOCUMENTS
  4,372,054  2/1983  Pomerantz et al. ........... 34/89 X
  4,385,452  5/1983  Deschaaf et al. .
  4,483,082 11/1984  Ellingson .
  4,713,894 12/1987  Roth et al. .
  4,827,627  5/1989  Cardoso .
  5,050,313  9/1991  Wakaeya et al. .

FOREIGN PATENT DOCUMENTS
  64-85698  3/1989  Japan .

Primary Examiner—Henry A. Bennett
Attorney, Agent, or Firm—Cushman, Darby & Cushman

[57] ABSTRACT

A clothes drying machine has a drum where clothes to be dried are placed. A detection electrodes of a degree-of-dryness detecting circuit are positioned in the drum, by which a microcomputer determines whether the clothes are dried. The drying machine has a preset function for in advance setting a time when a drying operation is to be completed. A display, which displays a specific mode when a time reaches the set time, clothes are not dried enough, and the drying operation continues, is provided in the drying machine.

7 Claims, 6 Drawing Sheets

DRYING MACHINE

BACKGROUND OF THE INVENTION

The present invention relates to a drying machine for drying clothes or the like contained in a drying chamber. Especially, the drying machine has a preset function, by which the time when a drying operation is to be completed can be set in advance.

A prior drying machine is disclosed, for example, in Japanese Laid-Open Patent Application 64-85698. To use a preset function, the user sets a time when the user wants the drying machine to complete its drying operation, by using a keyboard. When the user presses a start switch to start the preset function, the drying machine begins counting. A display indicates an actual time before the drying operation starts. The drying machine automatically starts the drying operation a predetermined time prior to the set time. The predetermined time is decided based on a maximum capacity of the drying machine, for example, five hours.

In the drying operation, the display indicates a rest time when the clothes in the drying chamber are dried. The drying machine has a detector of degree of dryness of clothes. When the drying operation of clothes progresses and the degree of dryness has reached a predetermined value, for example, 95%, a heater and a fan are deenergized.

In most cases, the drying operation is actually completed prior to the set time. After the drying operation is completed, a finishing operation starts twenty minutes prior to the set time. In the finishing operation, a power of the heater is reduced to half in comparison with that in the drying operation. The finishing operation is stopped at the set time.

However, the inventor of the present invention has noticed that a case can occur, where although the set time is up, the degree of dryness does not reach the predetermined value. In this case, the drying machine continues to dry the clothes until the degree of dryness reaches the predetermined value. At the set time, the display indicates zero which indicates that the drying operation is completed.

As a result, the user may misunderstand the indication, and believe that the drying operation is completed. The user might then open a door to remove clothes from the drying chamber. When the user opens the door, the drying operation is stopped but the clothes are not sufficiently dried.

Especially, in the type of drying machine in which after the finishing operation is completed, the heater heats clothes to maintain a warmness thereof, so-called soft keep operation, the user can easily misunderstand. That is, even though after the drying operation is completed the drying machine does not stop. Therefore, it is difficult for the user to determine whether the drying operation is completed.

SUMMARY OF THE INVENTION

It is an object of the present invention to provide a drying machine which can prevent for the user misunderstanding whether the clothes are dried enough.

In order to achieve the above object of the present invention, there is provided a drying machine comprising:

a) a drum constituting a drying chamber, for containing clothes to be dried;

b) means for heating air supplied to the chamber in a drying operation;

c) means for determining a degree of dryness of the clothes in the drying chamber;

d) display means for indicating that the drying operation is not completed.

e) preset means for setting a time when the drying operation is to be completed in advance; and f) control means, responsive to the dryness determining means, for determining the drying operation being completed based on the determination of the dryness determining means, and even though the time is up when the drying operation is not completed, for controlling the heating means to supply heat and for controlling the display means.

DETAILED DESCRIPTION OF THE PREFERRED EMBODIMENT

Figure 3:
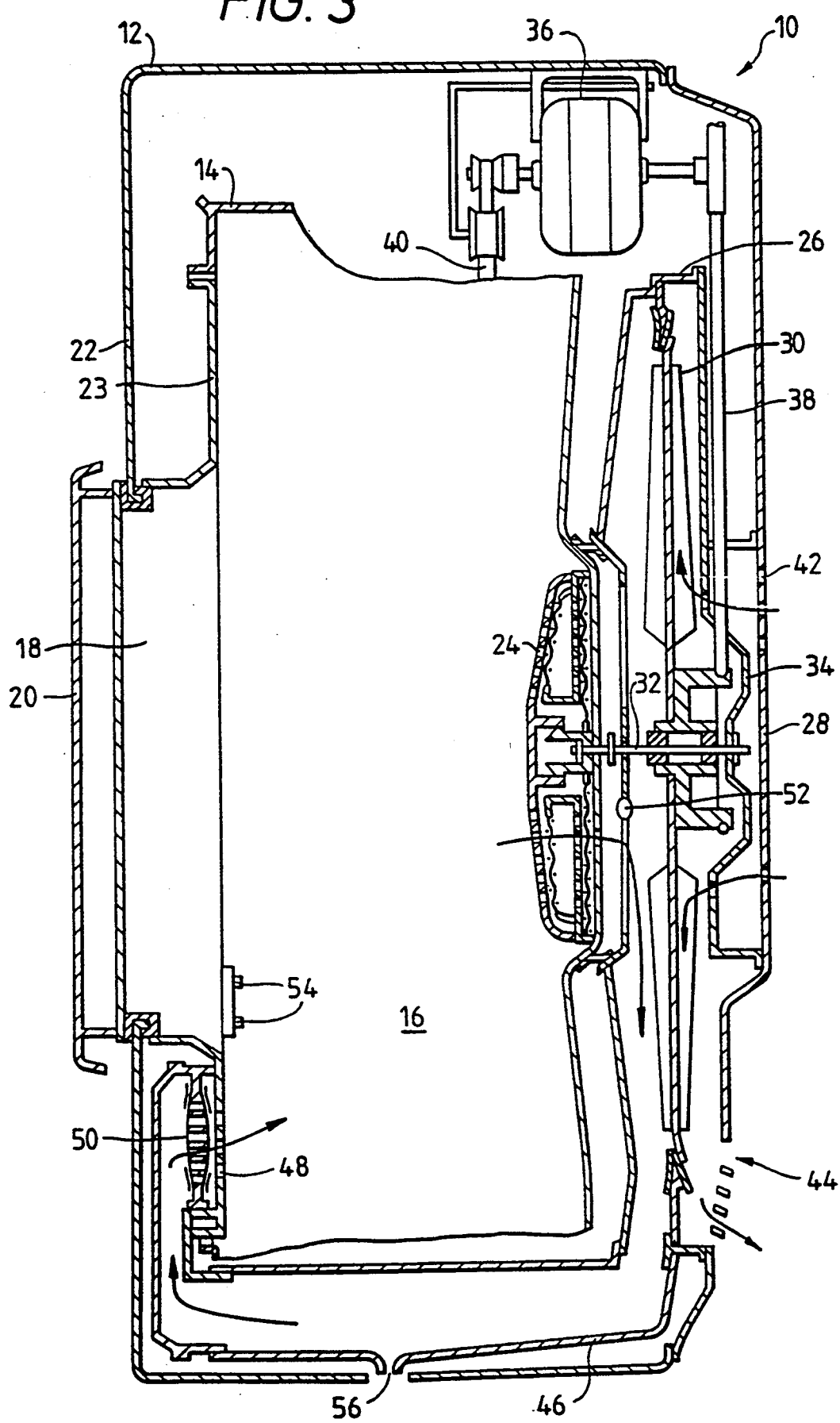
FIG. 3 is a vertical section of the drying machine according to the present invention.

An embodiment of the present invention will now be described as follows. FIG. 3 shows a whole construction of a clothes drying machine 10. The drying machine 10 has an outer case 12 and a drum 14 constituting a drying chamber 16 which is located in the outer case. An opening 18 through which clothes are put into and taken out of drying chamber 16 is formed in a middle front of outer cases 12. A door 20 which opens and closes opening 18 is pivotally mounted on a front face 22 of outer case 12.

Drum 14 is rotatably supported by a supporter 23 which is connected to front face 22. A filter 24 is located on a center of a rear face of drum 14.

A fan casing 26 is provided between the rear face of drum 14 and a rear plate 28 of outer case 12. A rotating heat exchanger 30 of a double fin type is provided within fan casing 26. An axial shaft 32, which is provided on a center of heat exchanger 30 and drum 14, is rotatably supported by a center portion of a rear board 34 of fan casing 26.

A motor 36, which rotates heat exchanger 30 using a belt 38, is provided in an upper portion within outer case 12. Motor 36 rotates drum 14 using a belt 40. Air inlets 42 are formed on a center portion of rear plate 28, and an air outlet 44 is formed on a bottom portion of rear plate 28.

When motor 36 rotates heat exchanger 30, outside air is drawn into the fan casing 26 through air inlets 42, and the air is exhausted to the outside through air outlet 44.

An air duct 46 is connected to an inside portion of fan casing 26, and connected also to air holes 48 which are located on a lower portion of supporter 23. A pair of heaters 50 are located near air holes 48 within air duct 46. When motor 36 rotates heat exchanger 30, air within drum 14 is drawn into air duct 46 through filter 24, and the air is returned into drying chamber 16 through air duct 46 and air holes 48.

A temperature sensor 52 is positioned near filter 24 on a front portion of fan casing 26. A pair of detection electrodes 54 are fixed to supporter 23. Detection electrodes 54 face an inside of drum 14 to make contact with clothes placed in drum 14.

When heat exchanger 30 is rotated and heaters 50 heats inside air, the inside air absorbs water from the clothes in drum 14. The humidified air is cooled by outside air at heat exchanger 30. Water is condensed at heat exchanger 30. The water is drained outside through a drain hole 56 which is located on air duct 46. The cooled air in air duct 46 is heated again by heater 50. The heated air flows into drum 14. The inside air is circulated again. Outside air is heated at heat exchanger 30, and is drained though air outlet 44.

When heater 50 is not energized and motor 36 is energized, inside air which is not heated is circulated.

Figure 4:
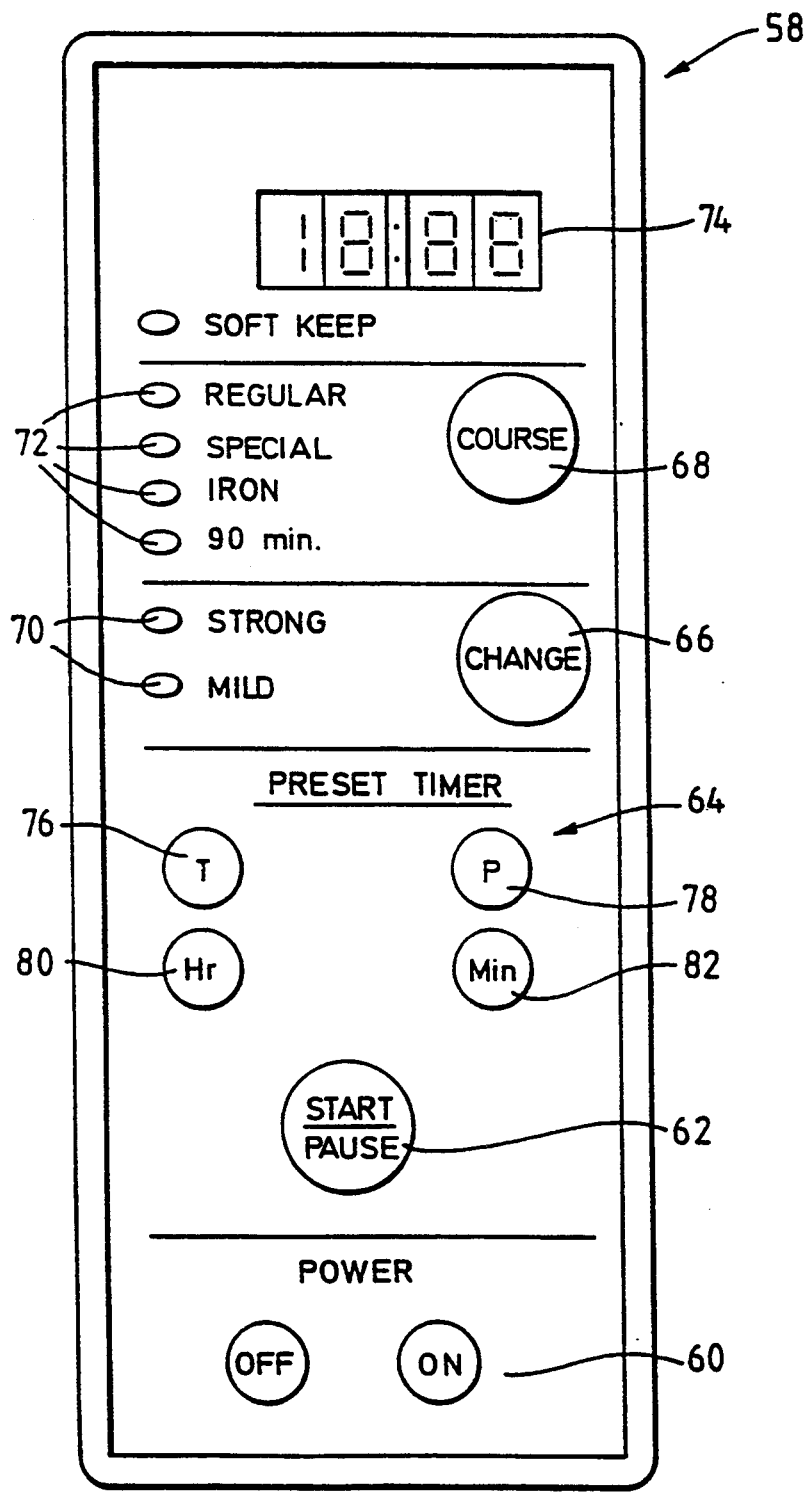
FIG. 4 is an operation panel of the drying machine.

FIG. 4 shows an operation panel 58 which is positioned near door 20 on front face 22. A power switch 60 which turns the power on and off, an operation switch 62 for starting operation and executing a temporary halt, and a timer switch 64 for setting an actual time and an advance preset time are in this operation panel 58. A change switch 66 which changes a power of heaters 50 and a course switch 68 for selecting an operation type are positioned on operation panel 58. Indicators 70, such as LEDs provided near change switch 66 show a power of heater 50, which is selected by the change switch.

Indicators 72, such as LEDs, are provided near course switch 68 to show which operation type is selected, regular type, special type, iron type, or 90 minute type. Special type is suitable for thick clothes. One heater 50 is energized for a longer time than a time of regular type after the degree of dryness reaches 95%. Iron type is suitable for the clothes to be ironed. When the degree of dryness reaches 85%, a drying operation is finished. 90 minutes type is suitable for shoes or a stuffed toy. A drying operation is executed for 90 minutes regardless of the degree of dryness.

A digital display 74, located on an upper portion of operation panel 58, indicates a remaining time to a time, which is set by timer switch 64, when the clothes are to be dried, indicates an actual time or advance preset time.

Timer switch 64 has a "TIME" key 76, a "PRESET" key 78, a "HR." key 80, and a "MIN." key 82. When a user sets an actual time, the user presses "TIME" key 76. The user sets a time by pressing "HR." key 80 and "MIN." key 82. Finally, the user presses "TIME" key 76, again, so that the user can set an actual time.

When the user sets a time in advance, that is, an advance preset time when the clothes are to be dried, the user presses "PRESET" key 78. The user sets the advance preset time by pressing "HR." key 80 and "MIN." key 82. Finally, the user presses "PRESET" key 78 again, so that the user can set the advance preset time. After the user sets the advance preset time, when the actual time reaches, for example, five hours before the advance preset time, the drying machine automatically starts the drying operation.

Figure 5:
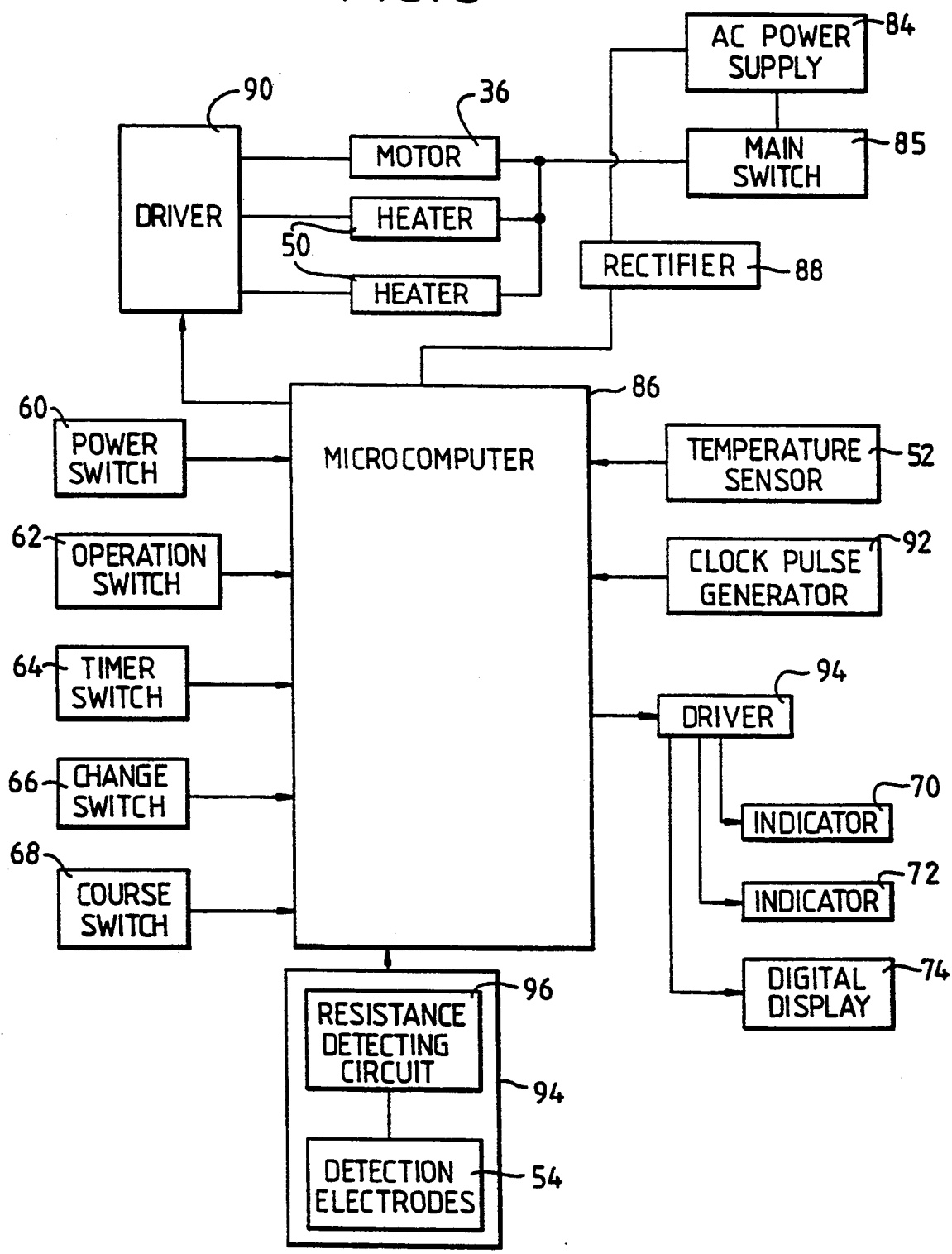
FIG. 5 is a block diagram showing an electrical arrangement of the drying machine.

FIG. 5 shows a block diagram which shows AC power supply 84 coupled to a microcomputer 86 through a rectifier 88. AC power supply 84 is coupled in parallel to motor 36 and heaters 50 through a main switch 85. Motor 36 and heaters 50 are coupled to microcomputer 86 through a driver 90 so that the microcomputer controls the motor and the heaters.

Power switch 60, operation switch 62, timer switch 64, change switch 66, and course switch 68 are connected to microcomputer 86. Temperature sensor 52 and a clock pulse generator 92 are connected to microcomputer 86. Indicators 70 and 72 and digital display 74 are coupled to microcomputer 86 through a driver 94 so that the microcomputer controls the indicators and the digital display based on power switch 60, operation switch 62, timer switch 64, change switch 66, and course switch 68.

A degree-of-dryness detecting circuit 94 comprises detection electrodes 54 and a resistance detecting circuit 96. Resistance detecting circuit 96 detects the resistance of the clothes placed in drum 14 contacting detection electrodes 54. Degree-of-dryness detecting circuit 94 detects the degree of dryness in accordance with the detected resistance, and the data of the degree of dryness is sent to microcomputer 86.

A suitable degree-of-dryness detecting circuit 94 is disclosed in U.S. Pat. No. 4,738,034, in detail, the contents of which are incorporated herein by reference. A degree of dryness is defined as follows:

W1: Weight of clothes in the state that the clothes are held for one day in a room: Temperature is 20° C., Humidity is 65%
W2: Actual weight of clothes
D: Degree of dryness (%)

$$D = \frac{W1}{W2} \times 100$$

A relationship of the resistance of the clothes contacting detection electrodes 54 and the degree of dryness is obtained through experiment. Therefore, the degree of dryness can be obtained from the resistance of the clothes.

Figure 6:
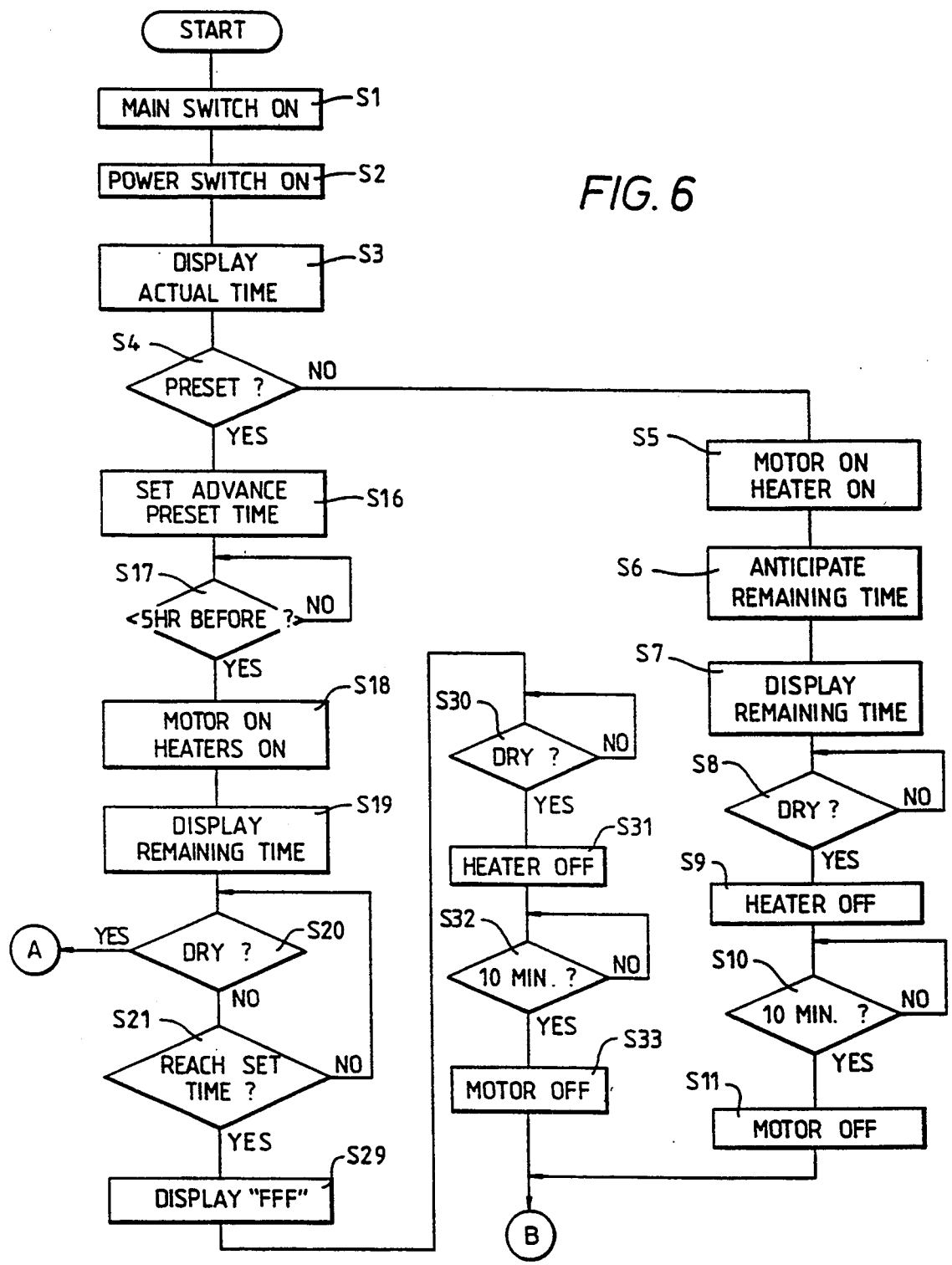
FIGS. 6 and 7 show respective segments of a flow chart showing operation of the drying machine.
Figure 7:
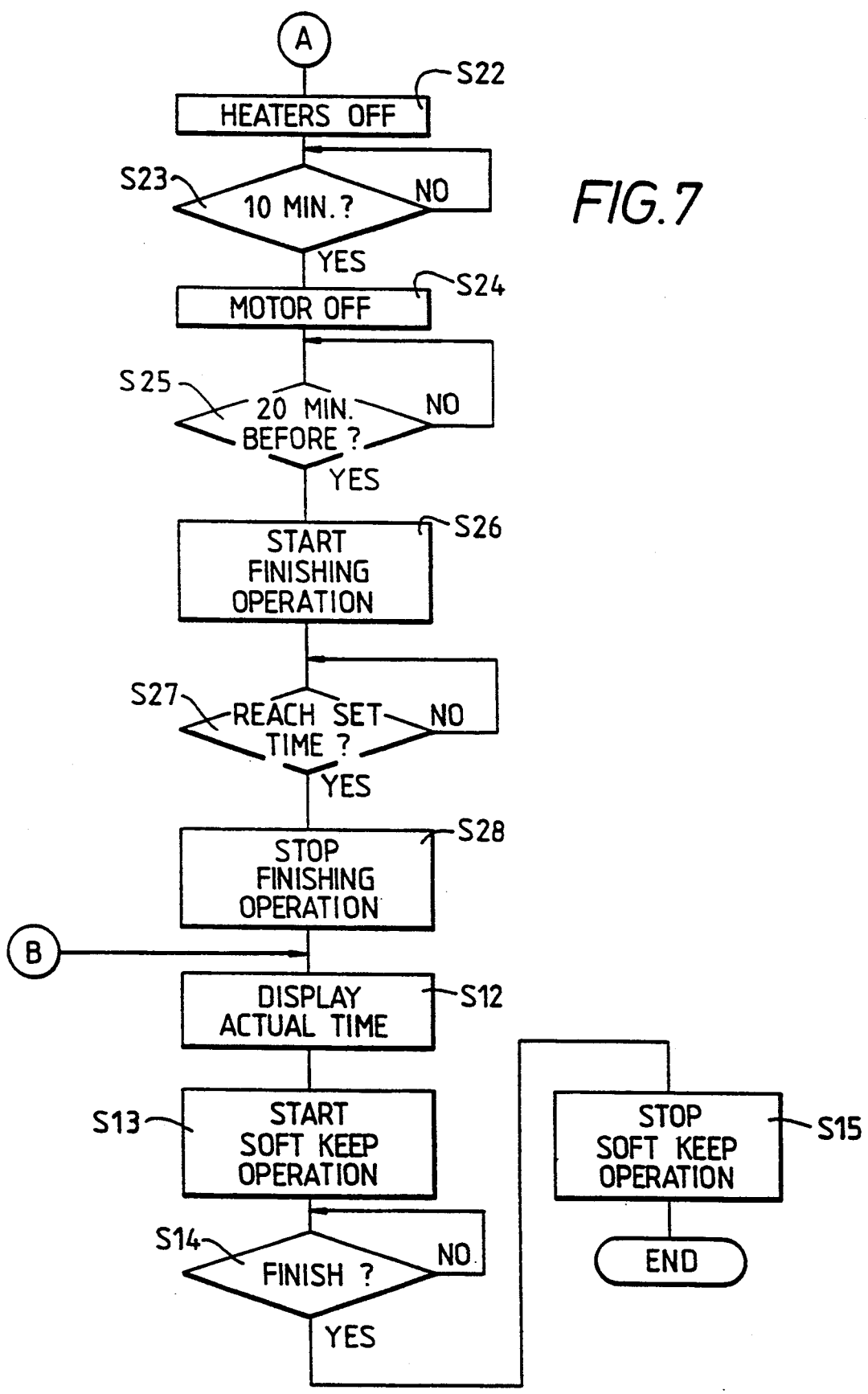

Operation of drying machine 10 will be described with reference to FIG. 6. At first, a user turns on main switch 85 (step S1). When power switch 60 is pressed (step S2), digital display 74 indicates an actual time (step S3).

Microcomputer 86 determines whether "PRESET" key 78 has been pressed (step S4). If not, microcomputer 86 starts a normal drying operation because the microcomputer determines that an advance preset function has not been set. Microcomputer 86 energizes motor 36 and heaters 50 so that the motor 36 rotates drum 14 and heat exchanger 30 and the heaters heat the inside air (step S5).

Microcomputer 86 receives data from degree-of-dryness detecting circuit 94, and anticipates a remaining time until the drying operation is to be completed based on the data (step S6). Digital display 74 indicates the remaining time (step S7). Microcomputer 86 determines whether the clothes are dried enough based on the data from degree-of-dryness detecting circuit 94 (step S8). Heaters 50 continues to heat air until microcomputer 86 determines that the clothes are dried enough.

If the result at step S8 is yes, heaters 50 are turned off (step S9). The cool air is supplied to drum 14 to cool the clothes for ten minutes because motor 36 is rotating even after heaters 50 are turned off. Microcomputer 86 determines whether ten minutes have elapsed since heaters 50 were turned off (step S10). If so, motor 36 stops rotating (step S11).

Digital display 74 displays an actual time (step S12). Drying machine 10 starts a soft keep operation to prevent making wrinkles in the clothes due to the weight of clothes itself (step S13). In soft keep operation, drum 14 rotates and only one heater 50 heats the air for ten seconds at every five minutes. Microcomputer 86 determines whether a condition, which indicates the soft keep operation is finished, is detected (step S14). If so, microcomputer 86 stops the soft keep operation (step S15). The condition is detected when door 20 is opened or the soft keep operation is executed for two hours. If not at step S14, the soft keep operation continues.

If before power switch 60 is pressed, when "PRESET" key 78 is pressed, the result at step S4 is yes. Flow then progresses to step S16 in which an advance preset time is set. A timer starts to count after power switch 60 is pressed. Microcomputer 86 determines whether a time of the timer reaches five hours before the preset time (step S17). If not, step S17 repeats. If so, microcomputer 86 turns on heaters 50 and motor 36 (step S18). Digital display 74 indicates a remaining time to the advance preset time which is set using "PRESET" key 78, "HR." key 80, and "MIN." key 82 (step S19).

Microcomputer 86 determines whether the clothes are dried enough based on the data from degree-of-dryness detecting circuit 94 (step S20). If the clothes are not dried enough, microcomputer 86 determines whether the time reaches the advance present time (step S21). If not, flow returns back to step S20.

As time passes, if microcomputer 86 determines that the clothes are dried enough in step S20, the microcomputer then turns off heaters 50 (step S22). Microcomputer 86 determines whether ten minutes has elapsed since heaters 50 are turned off (step S23). If so, motor 36 stops rotating (step S24). That is, the cool air is supplied to drum 14 for ten minutes since heaters 50 are turned off.

Microcomputer 86 determines whether a time of the timer has reached twenty minutes before the advance preset time (step S25). Until the result at step S25 becomes yes, heaters 50 and motor 36 are maintained off. If so at step S25, microcomputer 86 starts a finishing operation in which one heater 50 is energized and drum 14 is rotated to warm the clothes which are cooled while heaters 50 and motor 36 are stopped (step S26).

Step S27 determines whether a time of the timer reaches the advance preset time (step S27). When the time reaches the advance preset time, microcomputer 86 completes the finishing operation in which heater 50 is turned off and motor 36 is stopped (step S28). Flow then progresses to step S12.

Figure 2:
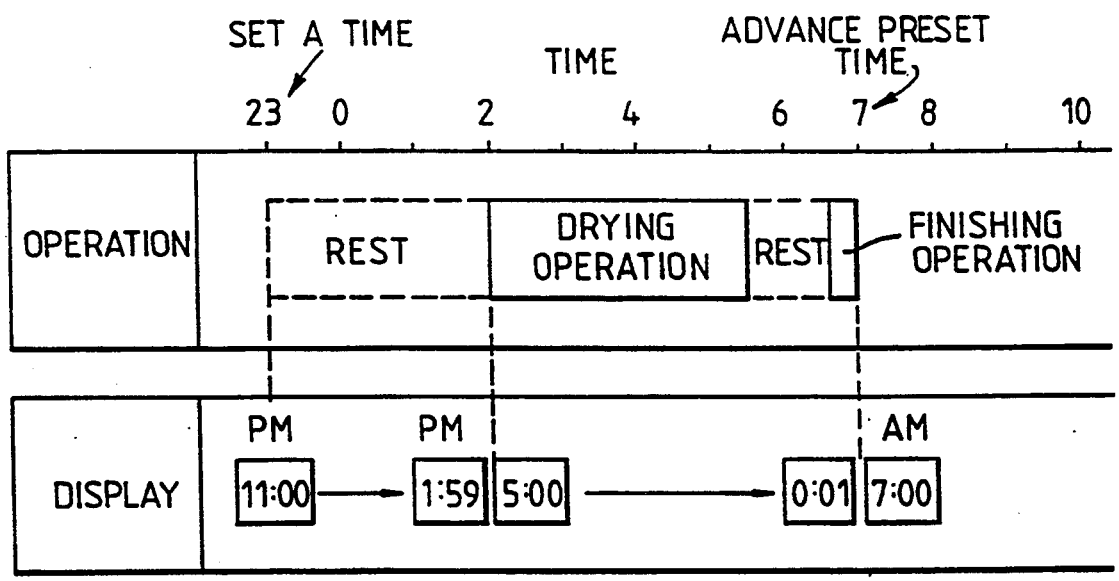
FIG. 2 is a timing chart explaining how a display indicates when the drying operation is completed before the set time according to the present invention.

FIG. 2 indicates the situation where before a time reaches the advance preset time, microcomputer 86 determines that the clothes are dried enough and turns off heaters 50. In this case, the user sets the advance preset time in 7 a.m. on the next morning at 23:00 (11 p.m.) to complete the drying operation. Until 2 a.m. (which is 5 hours prior to 7 a.m.), digital display 74 indicates an actual time. When the actual time becomes 2 a.m., digital display 74 displays five hours which indicates a remaining time until the advance preset time. At the advance preset time, digital display 74 indicates an actual time again.

When although the clothes are not dried enough, step S21 determines the time reaches the advance preset time, digital display 74 displays "FFF" which indicates the time exceeds the advance preset time (step S29). Microcomputer 86 determines whether the clothes are dried enough (step S30). Until the clothes are dried enough, flow continually repeats step S30. If the clothes are determined to be dried enough at step S30, heaters 50 stop heating the air (step S31).

Microcomputer 86 determines whether ten minutes has elapsed since heaters 50 were turned off at step S31 (step S32). If so, motor 36 stops rotating (step S33). Flow progresses to step S12.

Figure 1:
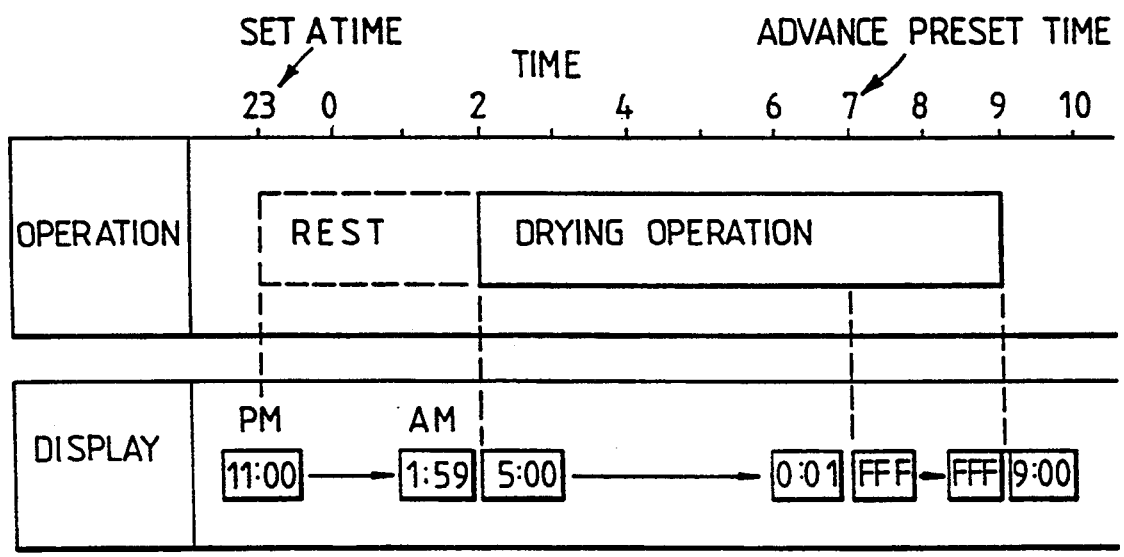
FIG. 1 is a timing chart explaining how a display indicates when a drying operation continues at a set time according to the present invention.

FIG. 1 indicates the situation where although a time reaches the advance preset time, microcomputer 86 determines that the clothes are not dried enough and heaters 50 are energizing continuously. In this case, the user sets the advance preset time in 7 a.m. on the next morning at 23:00 (11 p.m.) to complete the drying operation. Until 2 a.m. (which is 5 hours prior to 7 a.m.), digital display 74 indicates an actual time.

When the actual time becomes 2 a.m., digital display 74 displays five hours which indicates a remaining time until the advance preset time. At the advance preset time, digital display 74 displays "FFF". Until the clothes are dried enough, digital display 74 continues to display "FFF". When microcomputer 86 determines that the clothes are dried (in this case, 9 a.m.), digital display 74 displays an actual time again.

According to the embodiment, even if a time reaches the advance preset time and heater 50 must still heat continuously because the clothes are not dried, digital display 74 displays "FFF" which indicates that drying operation is still executing. As a result, the user can easily know that drying operation is not completed. Therefore, drying machine 10 can indicate that the user should not remove the clothes, which are not dried enough, from drying chamber 16.

Digital display 74 displays a remaining time until the advance preset time for a period from when the drying operation starts until the advance preset time. As a result, since the advance preset time is not necessarily identical with the time when the drying operation is finished, the user cannot recognize the remaining time until the end of the drying operation, but the remaining time until the advance preset time.

Of course, digital display 74 can display other than "FFF" to inform the user that the drying operation has not completed. Drying machine 10, for example, may have an additional indicator which indicates that the drying operation is executing. Any indication which is different than an indication of time is suitable.

When filter 24 is blocked by an obstacle or the clothes are put into drying chamber 16 beyond a estimated quantity, it takes much time to dry the clothes. As a result, a display of "FFF" can also inform the user a suspicion of the above conditions.

Although only a single preferred embodiment has been described in detail above, those skilled in the art will certainly understand that many modifications are possible in the preferred embodiment without departing from the teaching thereof.

All such modifications are intended to be encompassed within the following claims.

What is claimed is:

1. A drying machine, comprising:
   a) a drum having a drying chamber, for containing clothes to be dried;
   b) means for heating air supplied to the chamber during a drying operation;
   c) means for determining a degree of dryness of the clothes in the drying chamber;

d) display means for indicating a status of the drying operation, including an indication that the drying operation is not completed;
e) preset means for setting in advance a time when the drying operation is to be completed; and
f) control means, responsive to the dryness determining means, for determining the drying operation being completed based on the determination of the dryness determining means, and when the drying operation is not completed at the time set by the preset means, for controlling the heating means to supply heat and for controlling the display means to display an indication other than a time as the indication that the drying operation is not completed.

2. A drying machine according to claim 1, wherein the control means determines the drying operation being completed when a fixed period passes after the dryness determining means reaches a predetermined dryness value.

3. A drying machine according to claim 1, wherein the control means energizes the heating means a predetermined time before the time set by the preset means.

4. A drying machine according to claim 1, wherein the display means indicates a remaining time until the time set by the preset means.

5. A drying machine according to claim 4, wherein the display means changes the remaining time to a specific display even though the et time is up when the drying operation is not completed, so that a user can easily recognize that the drying operation continues.

6. A drying machine having an improved display function, comprising:
a) a drum constituting a drying chamber, for holding clothes to be dried;
b) means for selectively heating and supplying air to the chamber during a drying operation;
c) means for determining a degree of dryness of the clothes in the drying chamber;
d) time setting means, for allowing a user to set in advance a preset time, which is a time when the drying operation is requested to be completed;
e) display means for displaying information about the state of operation of the dryer; and
f) control means, responsive to the dryness determining means and time setting means, for:
  determining a time to start drying the clothes responsive to said preset time, and drying the clothes by commanding said heating means to supply air to the chamber at said time to begin the drying operation,
  commanding the display means to display a number indicative of a parameter of the preset operation while drying the clothes,
  determining if the drying operation is completed by monitoring the dryness determining means, and if so stopping the drying operation and commanding the display means to terminate the display,
  determining a state wherein the dryness determining means determines that the clothes are not sufficiently dried at and after the preset time, and for controlling the drying operation to continue until the clothes are sufficiently dried, and for controlling the display means to display an indication other than a number, to indicate that the drying operation is not completed even though the preset time has passed.

7. A drying machine as in claim 6, wherein said indication other than a number is a display with all letters.

* * * * *